(12) United States Patent
Nakajima et al.

(10) Patent No.: US 8,187,773 B2
(45) Date of Patent: May 29, 2012

(54) METHOD FOR GENERATING MASK PATTERN DATA AND METHOD FOR MANUFACTURING MASK

(75) Inventors: Yumi Nakajima, Tokyo (JP); Masaru Suzuki, Yokohama (JP); Takashi Sato, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 356 days.

(21) Appl. No.: 12/494,094

(22) Filed: Jun. 29, 2009

(65) Prior Publication Data

US 2010/0003608 A1    Jan. 7, 2010

(30) Foreign Application Priority Data

Jun. 30, 2008  (JP) .................................. 2008-170963

(51) Int. Cl.
   *G03F 9/00*           (2006.01)
(52) U.S. Cl. ................... 430/5; 430/22; 430/30; 716/53
(58) Field of Classification Search ................ 430/5, 30, 430/22; 716/53
   See application file for complete search history.

(56) References Cited

U.S. PATENT DOCUMENTS

| 7,052,810 | B2 | 5/2006 | Lu et al. |
| 7,247,412 | B2 | 7/2007 | Lee |
| 2004/0139418 | A1 | 7/2004 | Shi et al. |

FOREIGN PATENT DOCUMENTS

JP    2005-72309    3/2005

*Primary Examiner* — Christopher Young
(74) *Attorney, Agent, or Firm* — Finnegan, Henderson, Farabow, Garrett & Dunner, L.L.P.

(57) ABSTRACT

A method for generating data on mask pattern used to form a device pattern formed on a reflective exposure mask, wherein data on the mask pattern is generated based on a position correction amount table used to correct an amount of transfer position error occurring depending on at least one of pattern size and pattern pitch of the mask pattern when the mask pattern is transferred onto an exposure target member.

20 Claims, 13 Drawing Sheets

Pitch (duty ratio) →

| Size ↓ | 1 | 1.5 | 2 | 3 | 4 | 10 |
|---|---|---|---|---|---|---|
| 16 | -3.63 | -4.40 | -5.16 | -4.75 | -4.35 | -3.33 |
| 22 | -4.75 | -4.82 | -4.88 | -4.42 | -3.97 | -3.04 |
| 32 | -5.16 | -4.75 | -4.35 | -4.15 | -3.95 | -3.03 |
| 44 | -4.88 | -4.50 | -4.11 | -3.92 | -3.74 | -2.86 |
| 56 | -4.31 | -3.97 | -3.63 | -3.46 | -3.30 | -2.53 |
| 65 | -4.35 | -4.00 | -3.66 | -3.49 | -3.33 | -2.55 |
| 70 | -4.29 | -3.95 | -3.61 | -3.45 | -3.28 | -2.52 |
| 90 | -3.97 | -3.65 | -3.34 | -3.19 | -3.04 | -2.33 |
| 100 | -3.64 | -3.36 | -3.07 | -2.93 | -2.79 | -2.14 |
| 130 | -3.33 | -3.07 | -2.81 | -2.68 | -2.55 | -1.95 |

Position correction amount table (unit:nm)

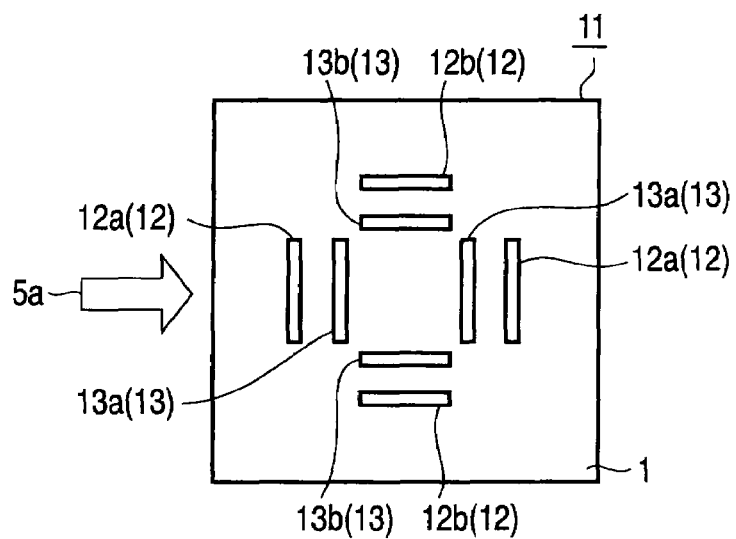
F I G. 7
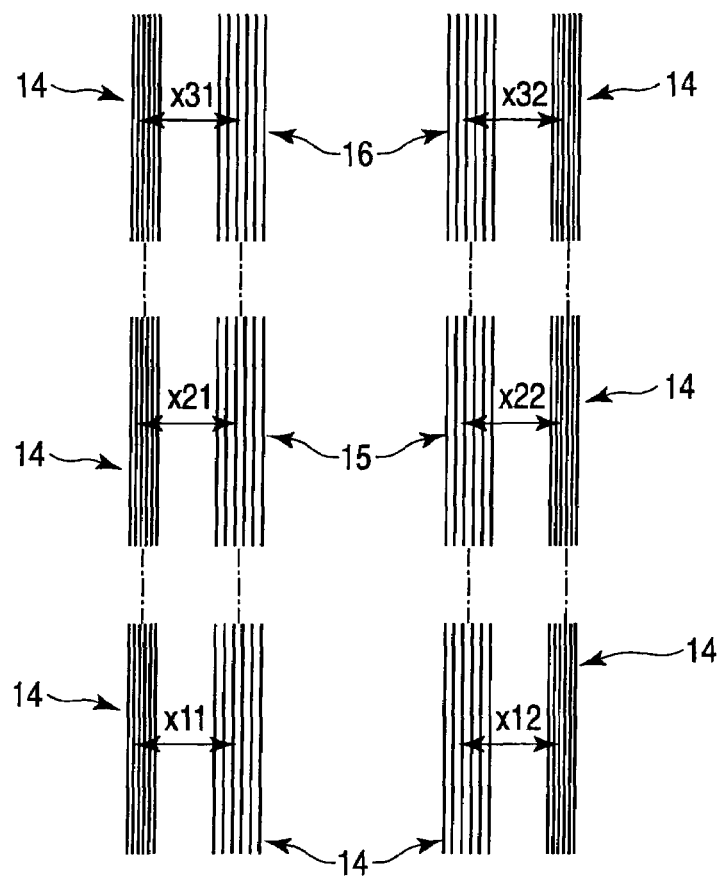
F I G. 8

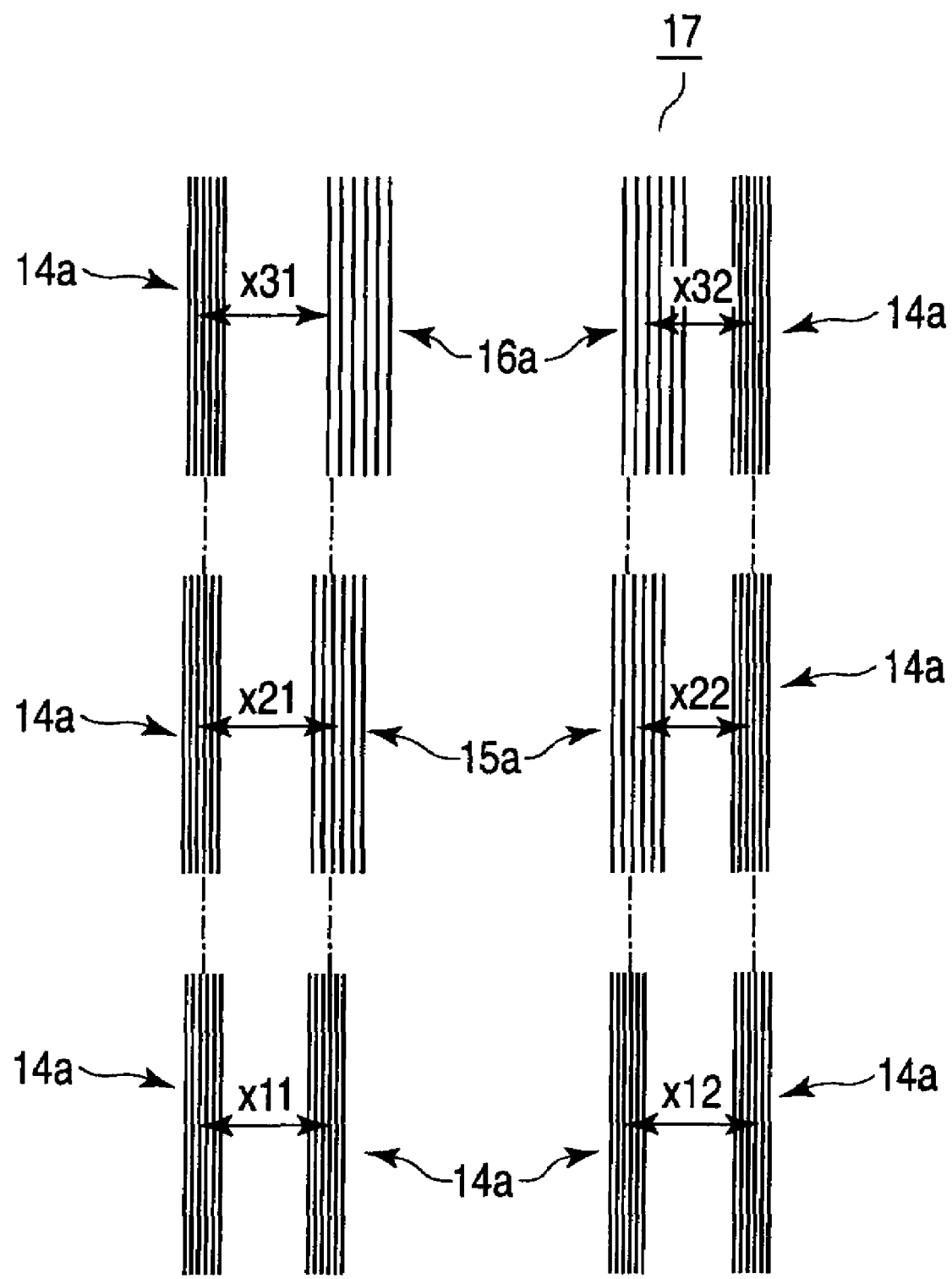
F I G. 9

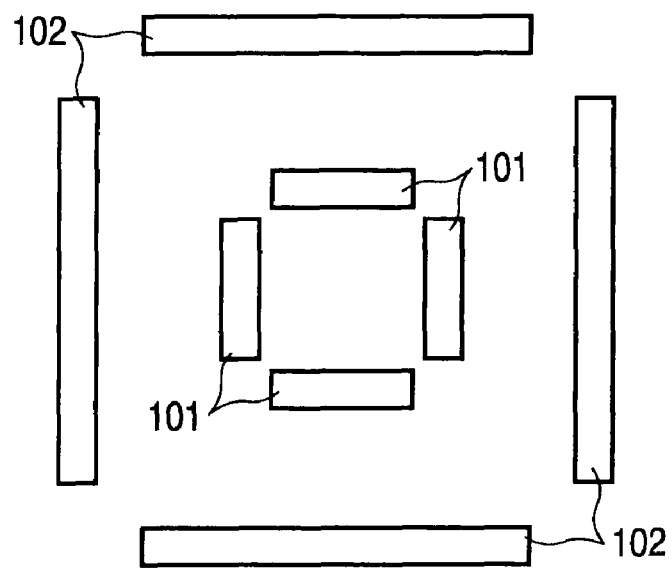
F I G. 13A
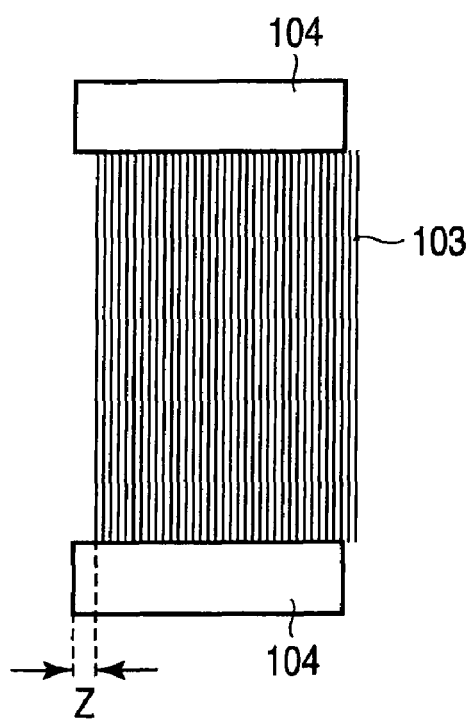
F I G. 13B

METHOD FOR GENERATING MASK PATTERN DATA AND METHOD FOR MANUFACTURING MASK

CROSS-REFERENCE TO RELATED APPLICATIONS

This application is based upon and claims the benefit of priority from prior Japanese Patent Application No. 2008-170963, filed Jun. 30, 2008, the entire contents of which are incorporated herein by reference.

BACKGROUND OF THE INVENTION

1. Field of the Invention

The present invention relates to a method for manufacturing a semiconductor device, and in particular, to an exposure mask for a lithography process using a reflective optical system.

2. Description of the Related Art

In recent years, miniaturization of semiconductor devices has increasingly reduced the line width of circuit patterns. In response to a demand for such a reduction, lithography techniques have reduced the wavelength of exposure light used to expose a resist. For a generation with a pattern width of about 45 nm, the use of light called extreme ultra violet (EUV) light in a wavelength region of about 13.5 has been examined. EUV light is expected to enable a reduction in pattern width, pattern size, or pattern pitch, which has not been achieved yet.

However, exposure using EUV light requires a reflective exposure mask and a reflective optical system instead of a light transmissive exposure mask and a light transmissive optical system, which are conventionally used. This is because of the conventional lack of a mask material that allows EUV light, having a wavelength of about 13.5 nm, to pass through if the exposure mask is formed to have a desired thickness.

If a reflective mask is used, light reflected by a mask surface needs to be guided into a projection optical system without interfering with light entering the same mask. Thus, the EUV light entering the reflective light is allowed to impinge obliquely on the mask surface at a predetermined angle (offset angle) (offset incidence). In this case, depending on the angle between the EUV light entering the mask and the mask pattern, a transferred image of the mask pattern on a wafer may differ from the mask pattern. For example, the contrast of the pattern may vary depending on whether or not the long sides of the pattern are arranged orthogonally or parallel to the direction of the incident light. This in turn varies the transferred image of the mask pattern on the wafer. In particular, when the incident EUV light is orthogonal to the mask pattern, the position of the transferred image of the mask pattern on the wafer may move (shift) in the direction of the incident light.

This pattern image shift phenomenon can be corrected by offsetting the entire mask pattern in a direction in which the shift is cancelled or setting an offset value via an exposure apparatus during exposure, as disclosed in, for example, Jpn. Pat. Appln. KOKAI Publication No. 2005-72309. However, even with the uniform offsetting of the entire mask pattern, it may be difficult to appropriately correct the shift phenomenon for the entire mask pattern.

BRIEF SUMMARY OF THE INVENTION

According to a first aspect of the present invention, there is provided A method for generating data on mask pattern used to form a device pattern formed on a reflective exposure mask, wherein data on the mask pattern is generated based on a position correction amount table used to correct an amount of transfer position error occurring depending on at least one of pattern size and pattern pitch of the mask pattern when the mask pattern is transferred onto an exposure target member.

According to a second aspect of the present invention, there is provided a program allowing a computer to execute a method for generating data on mask pattern used to form a device pattern formed on a reflective exposure mask, the program comprising: means for generating data on the mask pattern based on a position correction amount table used to correct an amount of transfer position error occurring depending on at least one of pattern size and pattern pitch of the mask pattern when the mask pattern is transferred onto an exposure target member.

BRIEF DESCRIPTION OF THE SEVERAL VIEWS OF THE DRAWING

FIG. 7 is a plan view schematically showing a measurement mask pattern according to a third embodiment;

FIG. 8 is a plan view showing an example of the configuration of the measurement mask pattern shown in FIG. 7;

FIG. 9 is a plan view showing a transferred image of the measurement mask pattern shown in FIG. 8;

FIG. 13A is a diagram showing an overlay error measurement mask pattern according to a comparative example for a fifth embodiment of the present invention which pattern has been transferred to a wafer, and FIG. 13B is a plan view showing overlay error between the overlay error measurement mask pattern and a device pattern formation mask pattern;

DETAILED DESCRIPTION OF THE INVENTION

Embodiments of the present invention will be described below with reference to the drawings.
(First Embodiment)

A first embodiment relates to a lithography technique using a reflective exposure mask. As described in the background art, in a lithography process using a reflective exposure mask for exposure light obliquely entering a mask pattern, the oblique incidence effect may cause a transferred image of the mask pattern on an exposure target to be an error. Thus, the present embodiment provides a method for generating a mask pattern data which method corrects, on the mask, the error amount (shift amount), which depends on the size and pitch of a device pattern that is an image of the mask pattern transferred onto the exposure target, thus allowing a desired pattern to be faithfully transferred onto the exposure target. In particular, in the present embodiment, a error correction amount table is created based on the error amount determined before the actual pattern transfer and corresponding to the size and pitch of the pattern transferred onto the exposure target. Then, based on the table, the data on the mask pattern is corrected. Now, with reference to FIGS. 1 to 5, the first embodiment according to the present invention will be specifically described.

Figure 1:
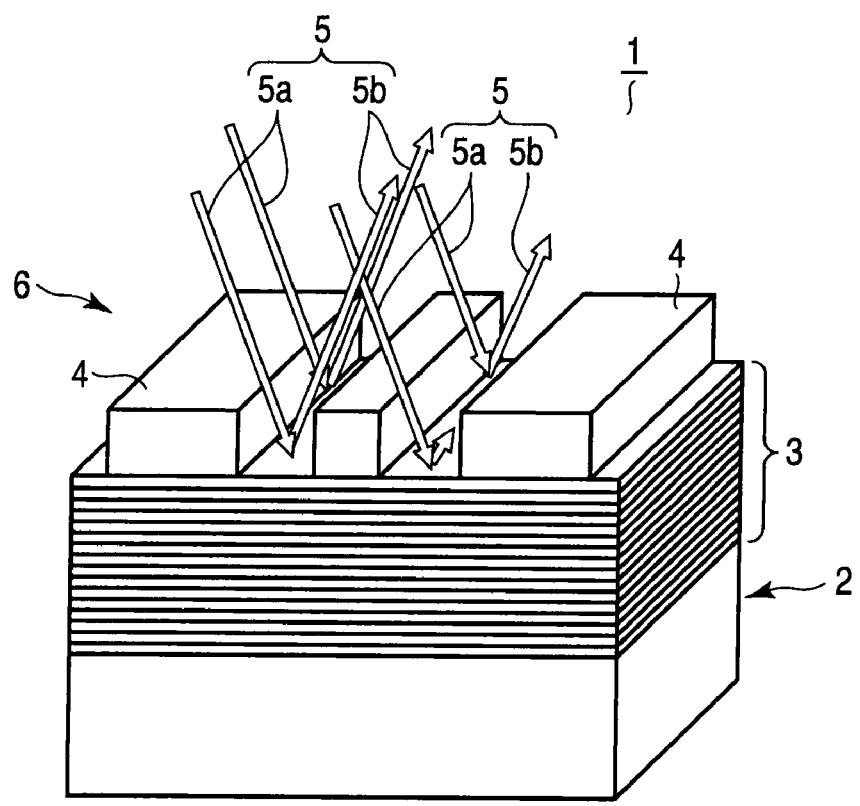
FIG. 1 is a perspective view schematically showing a reflective exposure mask according to a first embodiment of the present invention.
Figure 2:
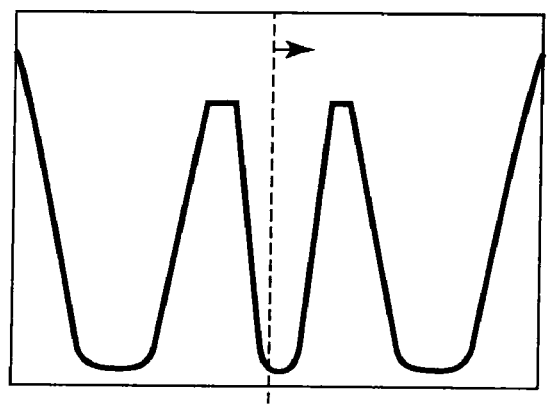
FIG. 2 is a diagram showing the loss amount of exposure light on a wafer and the error amount of a transferred pattern, during a reflective exposure process.

First, as shown in FIG. 1, a reflective exposure mask 1 according to the present embodiment is made up of a substrate 2, a reflection layer 3, and an absorption layer (absorption film) 4. The reflection layer 3 is provided on the substrate 2, which is a mask blank, to reflect exposure light 5. The absorption layer 4 is provided on the reflection layer 3 and formed at least to have the mask pattern 6 corresponding to a device pattern to be transferred onto the exposure target. That is, the mask pattern 6 is the pattern of a device pattern formation mask. Furthermore, the present embodiment uses, as the exposure light 5, extreme ultraviolet light (EUV) of a wavelength region of about 13.5 nm, to carry out an exposure process (pattern transfer).

As shown by white arrows in FIG. 1, the EUV exposure light 5 obliquely enters the surface of the reflection layer 3 and the mask pattern 6 at a preset predetermined angle. In the present embodiment, the EUV exposure light 5 enters the mask pattern 6 at an incident angle (offset angle) of about 6°. When the EUV exposure light 5 obliquely enters the mask pattern 6, incident light 5a is absorbed by, for example, side walls of the absorption layer 4 provided on the reflection layer 3 by patterning or reflected by the reflection layer 3. Therefore, as shown by the graph in FIG. 2, a loss occurs in the light quantity of the reflected light 5b transmitted to a wafer that is an exposure target. Furthermore, as shown in arrows in FIG. 2, the position of an image of the mask pattern 6 transferred onto the wafer deviates from an ideal transfer position set in a design stage (a transfer error).

Figures 3, 4:
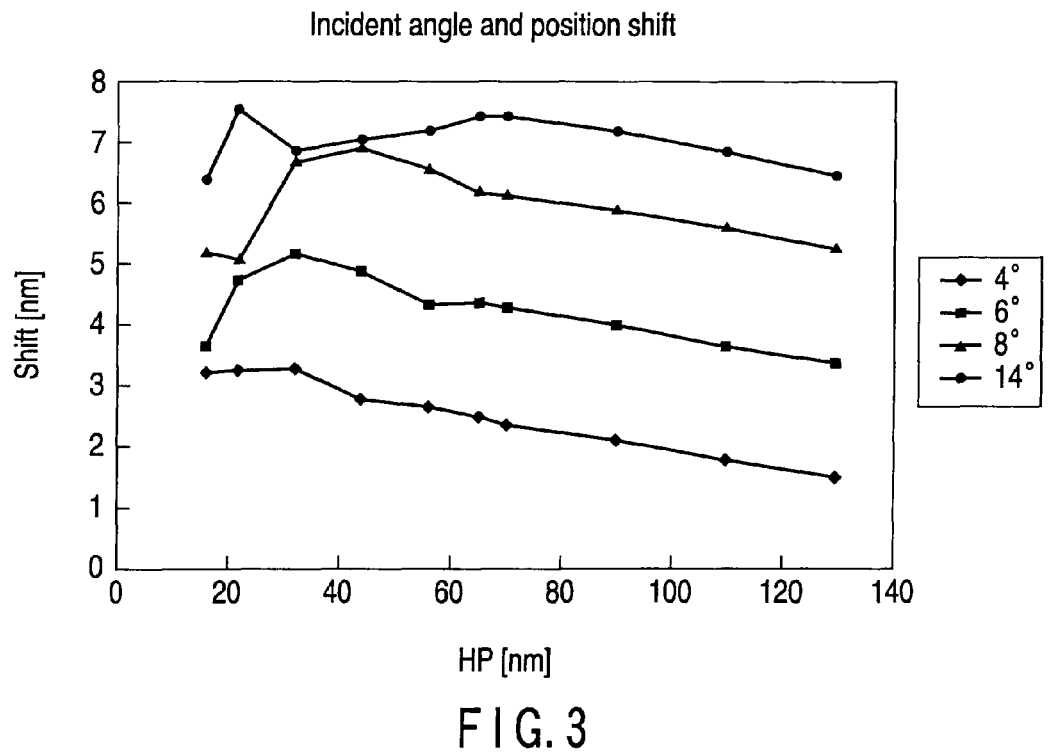
FIG. 3 is a diagram showing, in a graph form, the relationship between the half pitch and error amount of the transferred pattern on the wafer during the reflective exposure process, for each size of an incident angle.
FIG. 4 is a diagram showing a position correction amount table according to a first embodiment of the present invention.

FIG. 3 shows, in a graph form, the relationship between the error amount of the device pattern and a half pitch (HP), which is half of one pitch corresponding to the distance between adjacent line patterns included in the device pattern, which is the image of the mask pattern 6 to be transferred onto the wafer; the relationship being shown for each size of the incident angle of the incident light 5a. Each of the graphs shown in FIG. 3 indicates that the error amount of the device pattern varies depending on the size and pitch of the device pattern and the size of the incident angle of the incident light 5a.

FIG. 4 shows a error amount correction table used to correct the error amount of the device pattern to allow the device pattern to be formed on the wafer as designed. That is, FIG. 4 shows the position correction amount table (pattern shift amount correction table) showing the correction amount for a transfer error in the mask pattern 6 according to the pattern size and pitch of the device pattern. The position correction amount table shown in FIG. 4 is preferably set before the transfer of the device pattern onto the wafer. Specifically, first, the error amount corresponding to the size and pitch of the device pattern to be transferred onto the wafer is calculated at least experimentally or through simulation. The calculated error amount is contained in a table showing correction amounts for various device patterns. In the present embodiment, based on the position correction amount table shown in FIG. 4, data on the formation position of the mask pattern 6 is corrected in the design stage. Thus, design data on the mask pattern 6 is generated which allows the device pattern to be formed at an appropriate position on the wafer as designed.

Figure 5:
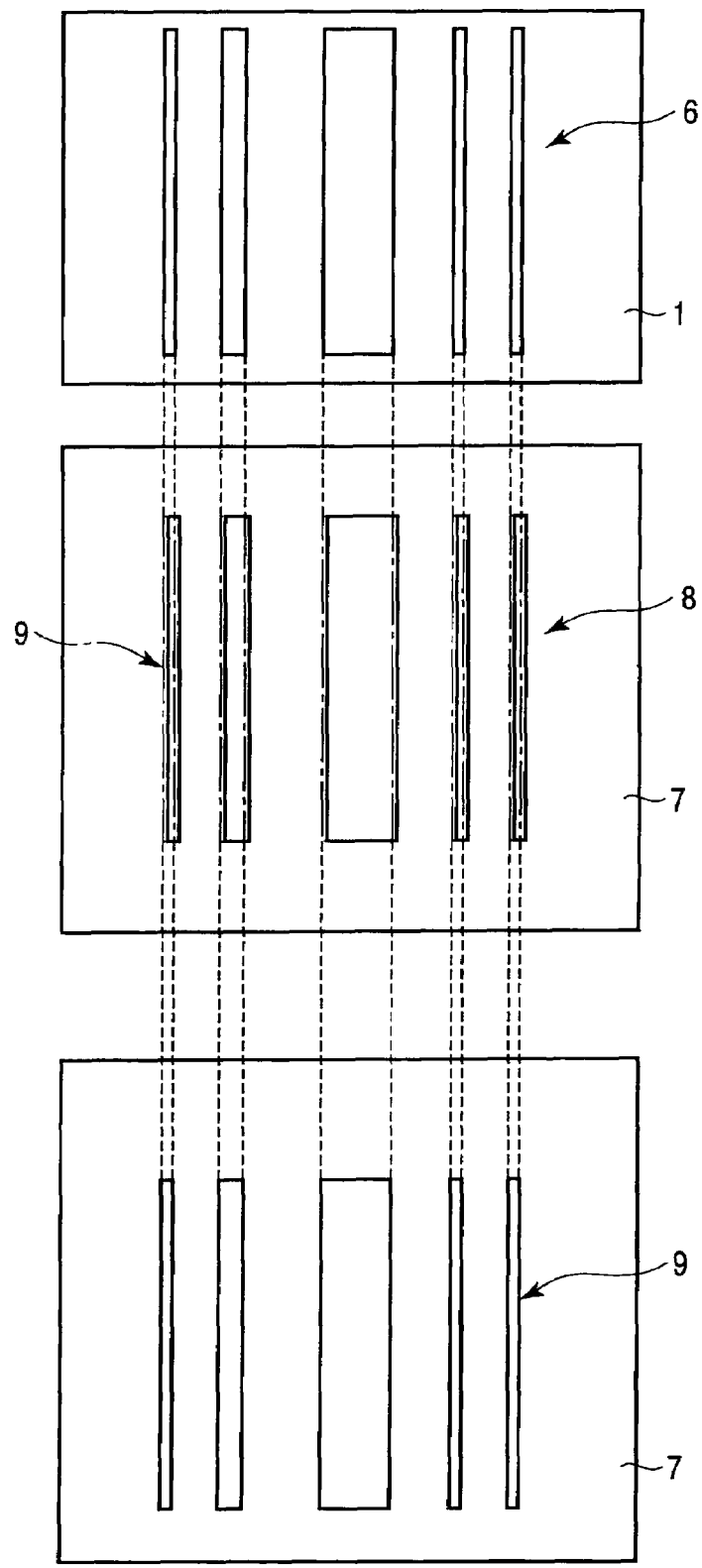
FIG. 5 is a plan view showing the results of a reflective exposure process according to the first embodiment of the present invention and the results of a reflective exposure process according to a comparative example for the first embodiment, the results according to the first embodiment being shown next to the results according to the comparative example.

The upper stage of FIG. 5 shows an example of the mask pattern 6 formed on the reflective exposure mask 1. As shown in the upper stage of FIG. 5, in the mask pattern 6 according to the present embodiment, a plurality of line patterns varying in size or pitch are mixed in the same layer. The reflective exposure mask 1 on which the mask pattern 6 configured as described above is formed is irradiated obliquely with the EUV exposure light 5 without any correction of the mask pattern 6 (offset irradiation). Therefore, as shown by solid lines in the middle stage of FIG. 5, the device pattern 8, which is an image of the mask pattern 6 transferred onto the wafer 7, is an error according to the size and pitch of the device pattern 8. As a result, the positional relationship between finer patterns and rougher patterns may differ from the designed one. In the middle stage of FIG. 5, a pattern 9 shown by an alternate long and short dash line is the original transferred image of the mask pattern 6 on the wafer 7. That is, the pattern 9 indicates the ideal formation position of the device pattern set in the design stage.

In contrast, first, the formation position of the mask pattern 6 is corrected (modified) based on the position correction amount table shown in FIG. 4. Thereafter, the reflective exposure mask 1 on which the corrected mask pattern (not shown in the drawings) is formed is irradiated obliquely with the EUV exposure light 5 for pattern transfer. Then, as shown by solid lines in the lower stage of FIG. 5, the corrected mask pattern can be transferred to the desired position as designed to appropriately form the ideal device pattern 9.

As described above, the first embodiment can appropriately correct the error of the transferred image 8 of the mask pattern 6 on the wafer 7 resulting from the oblique incidence of the exposure light 5 on the reflective exposure light mask 1, according to the size and pitch of the desired device pattern 9 to be formed, using the position correction amount table set before the pattern transfer. As a result, the present embodiment can provide a method for generating data on the mask pattern 6 which data allows the fine pattern 9 to be accurately formed during a lithography process using a reflective optical system.

(Second Embodiment)

Now, a second embodiment according to the present invention will be described with reference to FIGS. 6A and 6B. The same components of the second embodiments as those of the first embodiment are denoted by the same reference numerals and will not be described in detail. In the present embodiment, description will be given of a method of measuring, for each size of the pattern, the amount of a shift (error amount) in the pattern transfer position associated with the size of the pattern.

Figure 6A:
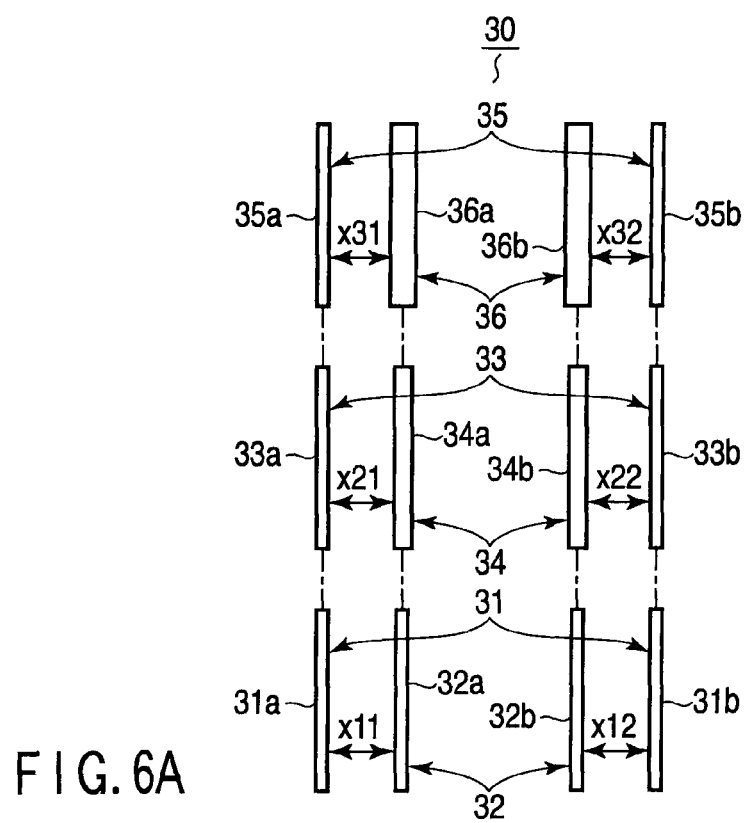
FIGS. 6A and 6B are plan views schematically showing a method for measuring the shift amount of a pattern position according to a second embodiment of the present invention.

FIG. 6A shows a transferred image of a mask pattern in which the pattern transfer position is not shifted. That is, FIG. 6A shows a transfer pattern 30 for which a pattern resulting from the first exposure and a pattern resulting from the second exposure are prevented from becoming an error. More specifically, the lower stage of FIG. 6A shows a first outer pattern 31 made up of a pair of first line patterns 31a and 31b and a first inner pattern 32 made up of a pair of second line patterns 32a and 32b and transferred inside the first outer pattern 31. The first line patterns 31a and 31b are transferred onto the wafer 7 by the first exposure. In contrast, the second line patterns 32a and 32b are transferred onto the wafer 7 by the second exposure. The first line patterns 31a and 31b and the second line patterns 32a and 32b are formed to have the same size. The pitch between the first line pattern 31a and second line pattern 32a shown in the left of the lower stage of FIG. 6A is denoted by x11. The pitch between the first line pattern 31a and second line pattern 32a shown in the right of the lower stage of FIG. 6A is denoted by x12.

The middle stage of FIG. 6A shows a second outer pattern 33 made up of a pair of third line patterns 33a and 33b and a second inner pattern 34 made up of a pair of fourth line patterns 34a and 34b and transferred inside the second outer pattern 33. The third line patterns 33a and 33b are transferred onto the wafer 7 by the first exposure, similarly to the first line patterns 31a and 31b shown in the lower stage of FIG. 6A. In contrast, the fourth line patterns 34a and 34b are transferred onto the wafer 7 by the second exposure, similarly to the second line patterns 32a and 32b shown in the lower stage of FIG. 6A. The third line patterns 33a and 33b are formed to have the same size. Likewise, the fourth line patterns 34a and 34b are formed to have the same size. However, the fourth line patterns 34a and 34b are formed to have a larger width than the third line patterns 33a and 33b. In contrast, the third line patterns 33a and 33b are formed to have the same size as that of the above-described first line patterns 31a and 31b. The pitch between the third line pattern 33a and fourth line pattern 34a shown in the left of the middle stage of FIG. 6A is denoted by x21. The pitch between the third line pattern 33b and fourth line pattern 34b shown in the right of the middle stage of FIG. 6A is denoted by x22.

The upper stage of FIG. 6A shows a third outer pattern 35 made up of a pair of fifth line patterns 35a and 35b and a third inner pattern 36 made up of a pair of sixth line patterns 36a and 36b and transferred inside the third outer pattern 35. The fifth line patterns 35a and 35b are transferred onto the wafer 7 by the first exposure, similarly to the third line patterns 33a and 33b shown in the middle stage of FIG. 6A and the first line patterns 31a and 31b shown in the lower stage of FIG. 6A. In contrast, the sixth line patterns 36a and 36b are transferred onto the wafer 7 by the second exposure, similarly to the fourth line patterns 34a and 34b shown in the middle stage of FIG. 6A and the second line patterns 32a and 32b shown in the lower stage of FIG. 6A. The fifth line patterns 35a and 35b are formed to have the same size. Likewise, the sixth line patterns 36a and 36b are formed to have the same size. However, the sixth line patterns 36a and 36b are formed to have a larger width than the fifth line patterns 35a and 35b. The sixth line patterns 36a and 36b also are formed to have a larger width than the above-described fourth line patterns 34a and 34b. In contrast, the fifth line patterns 35a and 35b are formed to have the same size as that of the above-described third line patterns 33a and 33b and first line patterns 31a and 31b. The pitch between the fifth line pattern 35a and sixth line pattern 36a shown in the left of the upper stage of FIG. 6A is denoted by x31. The pitch between the fifth line pattern 35b and sixth line pattern 36b shown in the right of the upper stage of FIG. 6A is denoted by x32.

As described above, the transfer pattern 30 is formed as what is called a bar in bar pattern. The transfer pattern 30 is not subjected to the error between the pattern resulting from the first exposure and the pattern resulting from the second exposure. Thus, as shown in FIG. 6A, the first to third outer patterns 31, 33, and 35 and the first to third inner patterns 32, 34, and 36 are each centered at the desired transfer position (reference position) set in the design stage and shown by an alternate long and short dash line in FIG. 6A. That is, the first to sixth line patterns 31a, 31b, 32a, 32b, 33a, 33b, 34a, 34b, 35a, 35b, 36a, and 36b are each transferred to the desired position set in the design stage. Thus, the transfer pattern 30 is used as a device pattern without change. In this case, in the transfer pattern 30, x11=x12. Furthermore, x21=x22. Moreover, x31=x32.

Figure 6B:
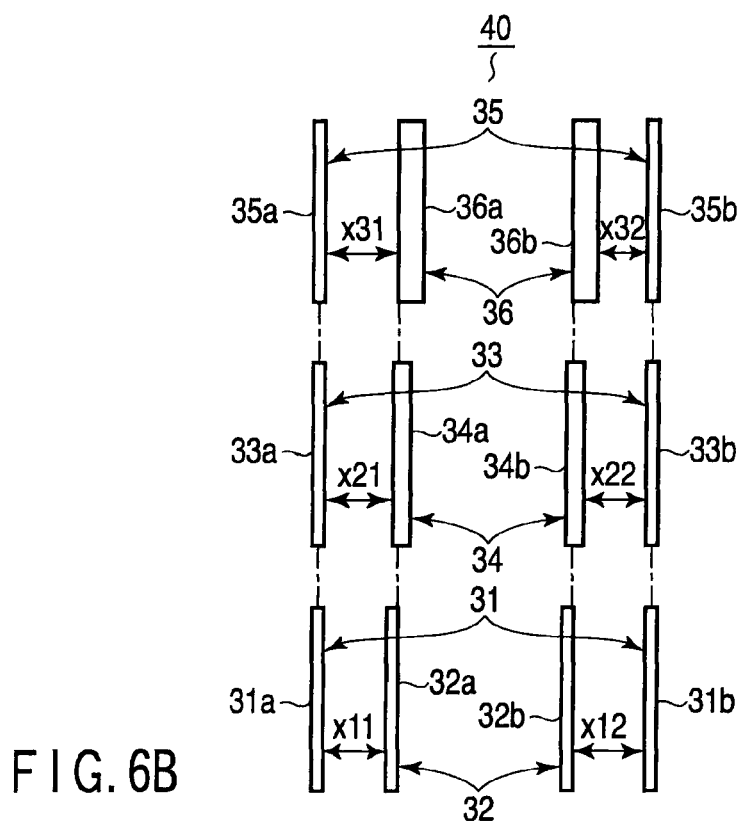

In contrast, FIG. 6B shows a transferred image of the mask pattern in which the pattern transfer position is shifted. That is, FIG. 6B shows a transfer pattern 40 for which the pattern resulting from the first exposure and the pattern resulting from the second exposure are an error. For the configuration of the transfer pattern 40 as a bar in bar pattern, the size of each of the patterns included in the transfer pattern 40, an exposure method, and the number of exposure operations, the patterns included in the transfer pattern 40 are similar to the line patterns 31a, 31b, 32a, 32b, 33a, 33b, 34a, 34b, 35a, 35b, 36a, and 36b shown in FIG. 6A.

As shown in FIG. 6B, the first to third outer patterns 31, 33, and 35 formed by the first exposure are each centered on a reference position shown by an alternate long and short dash line in FIG. 6B. That is, the first line patterns 31a and 31b, the third line patterns 33a and 33b, and the fifth line patterns 35a and 35b are each transferred to the desired position set in the design stage. In contrast, the first to third inner patterns 32, 34, and 36 formed by the second exposure are each centered on a position displaced from the reference position shown by the alternate long and short dash line in FIG. 6B.

Specifically, the second line pattern 32a shown in the left of the lower stage of FIG. 6B is formed closer to the first line pattern 31a with respect to the reference position. In contrast, the second line pattern 32b shown in the right of the lower stage of FIG. 6B is formed further from the first line pattern 31b with respect to the reference position. As a result, in the transfer pattern 40, x11<x12, unlike in the case of the above-described transfer pattern 30.

The fourth line pattern 34a shown in the left of the middle stage of FIG. 6B is formed further from the third line pattern 33a with respect to the reference position. In contrast, the fourth line pattern 34b shown in the right of the middle stage of FIG. 6B is formed closer to the third line pattern 33b with respect to the reference position. As a result, in the transfer pattern 40, x21>x22, unlike in the case of the above-described transfer pattern 30.

The sixth line pattern 36a shown in the left of the upper stage of FIG. 6B is formed further from the fifth line pattern 35a with respect to the reference position. In this case, the sixth line pattern 36a is formed much further from the fourth line pattern 34a, which is formed to be narrower than the sixth line pattern 36a, with respect to the reference position. In contrast, the sixth line pattern 36b shown in the right of the upper stage of FIG. 6B is formed closer to the fifth line pattern 35b with respect to the reference position. In this case, the sixth line pattern 36b is formed much further from the fourth line pattern 34b, which is formed to be narrower than the sixth line pattern 36b, with respect to the reference position. As a result, in the transfer pattern 40, x31>x32, unlike in the case of the above-described transfer pattern 30.

In the transfer pattern 40 configured as described above and a shown in FIG. 6B, the amount of the error (position shift amount) X1 between the first outer pattern 31 and the second inner pattern 32 is calculated to be X1=(x11−x12)/2 by means of a error measuring instrument (not shown in the drawings). As described above, the four line patterns, that is, the two first line patterns 31a and 31b, provided in the first outer pattern 31, and the two line patterns 32a and 32b, provided in the second inner pattern 32, are all formed to have the same size. Of the first and second line patterns 31a, 31b, 32a, and 32b, only the first line patterns 31a and 31b are each formed at the reference position without becoming an error. Thus, X1 corresponds to the reference amount of the error between the patterns resulting from the first exposure and the patterns of the same sizes resulting from the second exposure, the error being caused by the exposure process. The amount of the error X2 of the fourth line patterns 34a and 34b with respect to the third line patterns 33a and 33b is calculated to be X2=(x21−x22)/2−X1. Similarly, the amount of the error X3 of the sixth line patterns 36a and 36b with respect to the fifth line patterns 35a and 35b is calculated to be X3=(x31−x32)/2−X1. Of course, using the transfer pattern 40 including the error patterns 32a, 32b, 34a, 34b, 36a, and 36b as a device pattern without change is inappropriate.

As described above, the second embodiment can exert effects similar to those of the above-described first embodiment. Even if the exposure process is carried out twice to form a bar in bar pattern on the wafer 7 so that mask patterns of difference sizes are mixed on the single mask 1, the position shift amount can be easily and quickly measured for each pattern size using a common error measuring instrument. Moreover, using patterns of the same sizes for the first and second exposure processes allows the amount of the exposure error between the first and second exposures resulting from the exposure process to be measured. Therefore, the error amount can be more quickly and more accurately measured for each pattern size during the reflective EUV exposure process. More accurate data can thus be more efficiently acquired.

(Third Embodiment)

Now, a third embodiment of the present invention will be described with reference to FIGS. 7 to 9. The same components of the third embodiments as those of the first and second embodiments are denoted by the same reference numerals and will not be described in detail.

As described above, in a lithography process using a reflective optical system, when the mask pattern 6 is formed, the patterns included in the mask pattern 6 need to be arranged with the error amount (pattern shift amount) corresponding to the size of the mask pattern taken into account for each pattern size. To achieve this, the pattern shift amount corresponding to the pattern size needs to be determined before formation of the mask pattern 6. In the present embodiment, a method will be described which enables the shift amount of the transfer position of the pattern resulting from the exposure during an EUV exposure process to be appropriately measured before the formation of the mask pattern 6.

Although not shown in the drawings, as described in the background art, the contrast of the pattern may vary depending on whether or not the long sides of a line pattern in a line and space pattern (L/S pattern) are arranged orthogonally or parallel to the incident direction of exposure light 5. In particular, when the long sides of the line pattern are arranged orthogonally to the incident direction of the exposure light 5, the light intensity on the wafer 7 is subjected to a position shift. Therefore, a pattern shift results from the exposure. Thus, in the present embodiment, a bar in bar pattern, used for a common error measuring instrument (not shown in the drawings), is utilized to appropriately measure the shift amount of the transfer position of the pattern resulting from the EUV exposure process, before the formation of the mask pattern 6.

FIG. 7 schematically shows a bar in bar pattern 11 according to the present embodiment. The bar in bar pattern 11 is used as a measurement mask pattern to measure a transfer error in the device pattern 8 transferred onto the wafer 7. The measurement mask pattern 11 is formed, using the absorption layer 4, as a periodic pattern with the same pitch as that of the mask pattern 6 so as to have the same size as that of the mask pattern 6. Furthermore, the measurement mask pattern 11 is formed on the reflective exposure mask 1 in an area different from that in which the mask pattern 6 is formed. Specifically, the measurement mask pattern 11 is formed in an area corresponding to the outside of a device pattern formation area of an actually manufactured product so as not to be transferred into the device pattern formation area together with the device pattern.

More specifically, the measurement mask pattern 11 includes an outer pattern group having plural pairs of outer patterns 12 such that each pair includes patterns 12a, 12b which are periodic patterns with the same pitch or have the same size and which are arranged opposite each other. Here, the measurement mask pattern 11 includes two pairs of the outer patterns 12 each made up of a combination of at least two patterns 12a, 12b of the same size arranged parallel to each other; the combined patterns 12a, 12b are arranged orthogonally to each other. The measurement mask pattern 11 also includes an inner pattern group having plural pairs of inner patterns 13 each arranged inside the corresponding pair of outer patterns 12a and 12b and each made up of patterns 13a, 13b which are periodic patterns with the same pitch or have the same size and which are arranged opposite each other; the pairs of the inner patterns 13 are composed of periodic patterns with different pitches or have different sizes. Here, the measurement mask pattern 11 includes two pairs of the outer patterns 13 in which each pair is made up of a combination of at least two patterns 13a, 13b of the same size arranged parallel to each other and in which the combined patterns 13a, 13b are arranged inside the corresponding outer patterns 12 and orthogonally to each other; the patterns 13a and 13b have different sizes.

The mask pattern 11 according to the present embodiment is configured to have a pattern layout such that for images of the outer patterns 12 and the inner patterns 13 transferred onto the wafer 7 during a single EUV exposure process, the amount of the error of the image of the inner pattern 13 with respect to the image of the outer pattern 12 is measured to enable determination of a difference in the error amount of the transferred images corresponding to the difference in size between the outer patterns 12 and the inner patterns 13.

Furthermore, in the present embodiment, the pair of the outer pattern 12a and the inner pattern 13a are arranged on the reflective exposure mask 1 perpendicularly to the incident direction of incident exposure light 5a shown by a white arrow in FIG. 7. In the measurement mask pattern 11, made up of the plurality of bar in bar marks 12 and 13 configured as described above, marks (patterns) with a size serving as a reference for error measurement are adopted for either the outer marks 12a and 12b or the inner marks 13a and 13b. Additionally, patterns with a size serving as a reference are similarly adopted for a part of the marks for which the above-described patterns with the reference size are not adopted, whereas patterns with a size for which the shift amount is to be determined are adopted for the remaining part of these marks. Exposing the wafer 7 to the measurement mask pattern 11 allows the difference in the position shift amount with respect to the reference pattern to be measured for each pattern size. As a result, data on the error amount can be more quickly and more accurately acquired. Here, the patterns with the size serving as the reference are adopted for the outer marks 12a and 12b. The measurement mask pattern 11 need not necessarily be formed on the reflective exposure mask 1 together with the mask pattern 6. The measurement mask pattern 11 may be formed on a mask (not shown in the drawings) dedicated to the measurement mask pattern.

More specifically, as shown in FIG. 8, measurement is performed on the difference between the shift amount of a first pattern 14 with an HP size of about 20 nm and each of the shift amounts of a second pattern 15 and a third pattern 16 with sizes different from that of the first pattern 14. The second pattern 15 and the third pattern 16 have different sizes. Furthermore, as shown by arrows in FIG. 8, the pitch between the first patterns 14 is denoted by x11 or x12. Similarly, the pitch between the first pattern 14 and the second pattern 15 is denoted by x21 or x22. Similarly, the pitch between the first pattern 14 and the third pattern 16 is denoted by x31 or x32. x11=x12=x21=x22=x31=x32. Alternate long and short dash lines in FIG. 8 indicate reference positions corresponding to the centers of the first pattern 14, the second pattern 15, and the third pattern 16.

In this case, first, the first pattern 14 is used to form a bar in bar pattern (measurement mask pattern) on the reflective exposure mask 1. The bar in bar pattern is further formed on the reflective exposure mask 1 such that with the first pattern 14 located on the outer or inner bar, the second pattern 15 and the third pattern 16 are arranged on the remaining bar. The reflective exposure mask 1 on which such a bar in bar pattern is formed is used to perform reflective EUV exposure.

FIG. 9 shows the results of the above-described reflective EUV exposure. As is apparent from a transfer pattern 17 shown in FIG. 9, unlike the first pattern 14, second pattern 15, and third pattern 16 shown in FIG. 7, a transferred image 14a of the first pattern 14, a transferred image 15a of the second pattern 15, and a transferred image 16a of the third pattern 16 are arranged such that the center of the formation position of each of the transferred images is displaced from the corresponding alternate long and short dash line, indicating the reference. That is, the formation positions of the first pattern 14, second pattern 15, and third pattern 16 arranged such that the pitches between the patterns on the reflective exposure mask 1 are x11=x12=x21=x31=x32 in FIG. 8 change as a result of the exposure, owing to a difference in shift amount. Namely, each of the transferred images 14a, 15a, and 16a of the first, second, and third pattern 14, 15, and 16 differs from that which is set in the design stage. However, in the present embodiment, for example, the shift amount of the second pattern 15 with respect to the first pattern 14 can be calculated by the expression (x21−x22)/2. Similarly, the shift amount of the third pattern 16 with respect to the first pattern 14 can be calculated by the expression (x31−x32)/2.

That is, according to the present embodiment, the alignment measuring instrument is used to measure the error inside the inner pattern, having a size different from that of the outer pattern 12. Thus, easy and quick measurement can be performed on the difference in the position shift amount (error amount) of the transfer pattern resulting from the difference in size between the outer pattern 12 and the inner pattern 13. Pattern data based on which the measurement mask pattern 11 is formed on the reflective exposure mask 1 is also preferably obtained based on the position correction amount table as in the case of the mask pattern 6.

As described above, the third embodiment can exert effects similar to those of the first and second embodiments. Furthermore, even if patterns with different sizes are mixed on the single mask 1, the position shift amount can be easily and quickly measured for each pattern size using a common error measuring instrument. Thus, the error amount can be more quickly and more accurately measured for each pattern size during the reflective EUV exposure process. Consequently, more accurate data can be more efficiently acquired.

(Fourth Embodiment)

Figure 11:
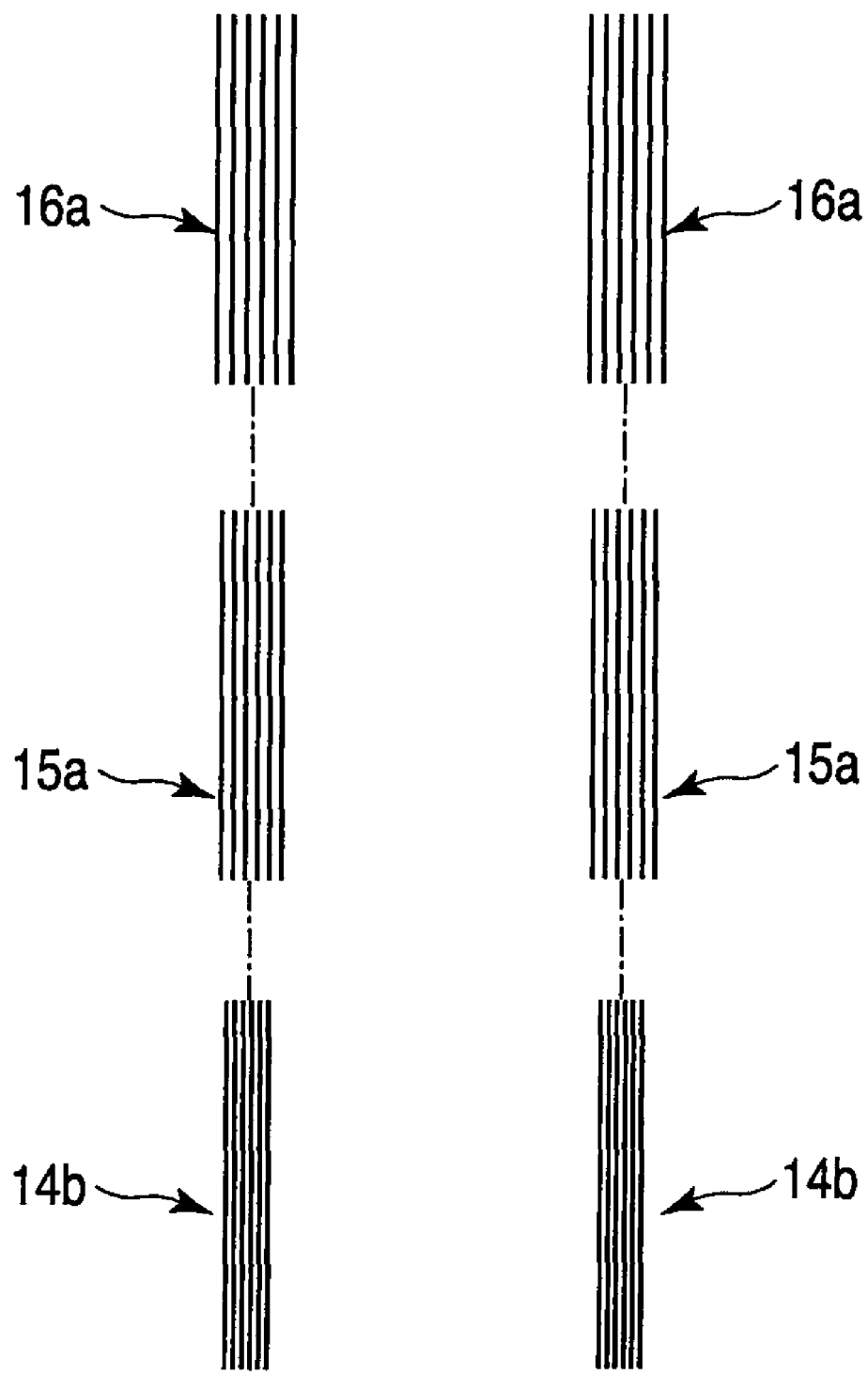
FIG. 11 is a plan view showing the results of the second reflective exposure process using the measurement mask pattern according to the fourth embodiment of the present invention.
Figure 12:
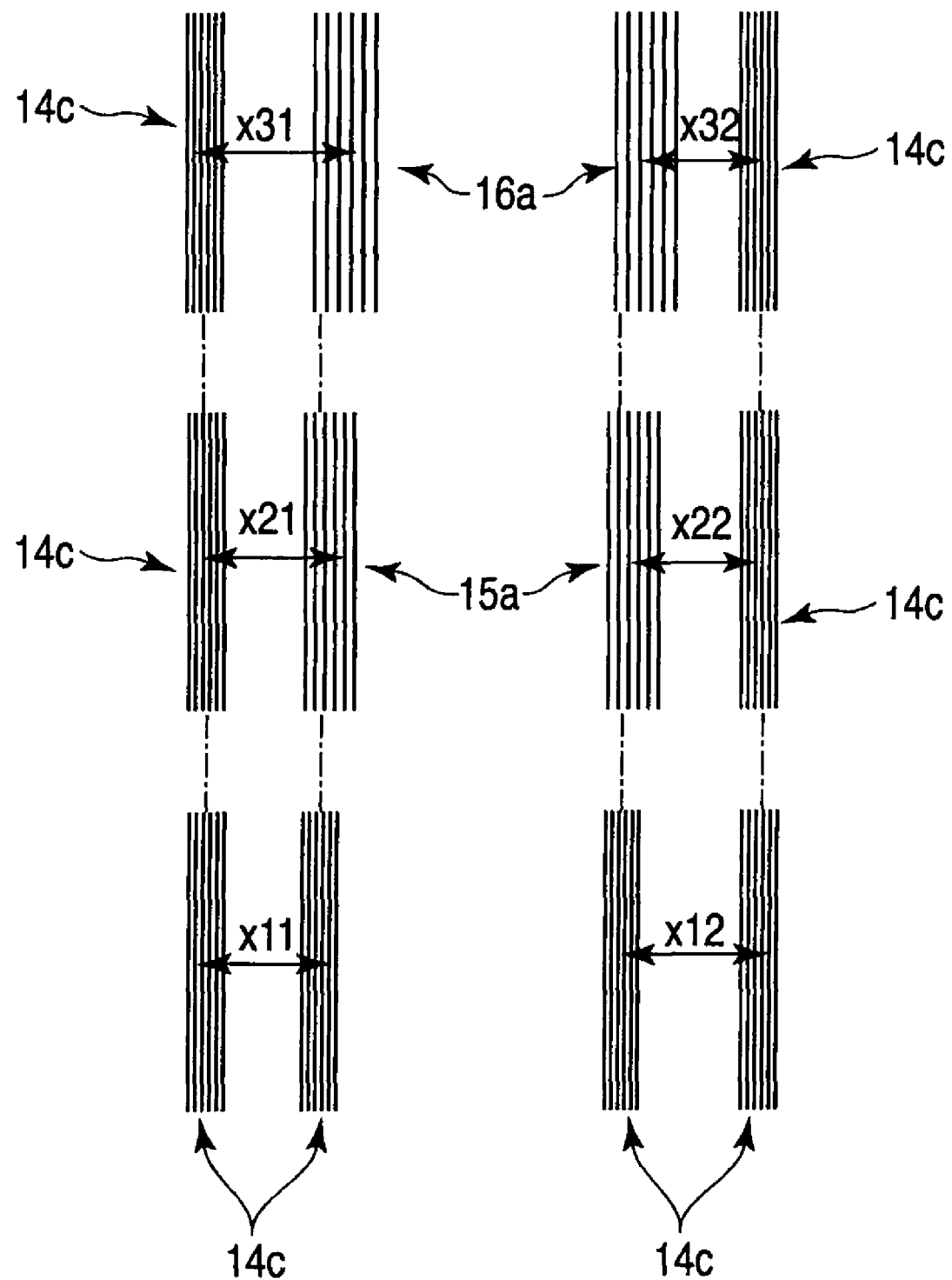
FIG. 12 is a plan view of the results of the first reflective exposure process shown in FIG. 10 and the results of the second reflective exposure process shown in FIG. 11, the results of the first reflective exposure process being overlaid on the results of the second reflective exposure process.

Now, a fourth embodiment according to the present invention will be described with reference to FIGS. 10 to 12. In the present embodiment, unlike in the case of the third embodiment, a technique for allowing the position shift amount to be measured for each pattern size through two exposure processes will be described. The same components of the fourth embodiments as those of the first to third embodiments are denoted by the same reference numerals and will not be described in detail.

Figure 10:
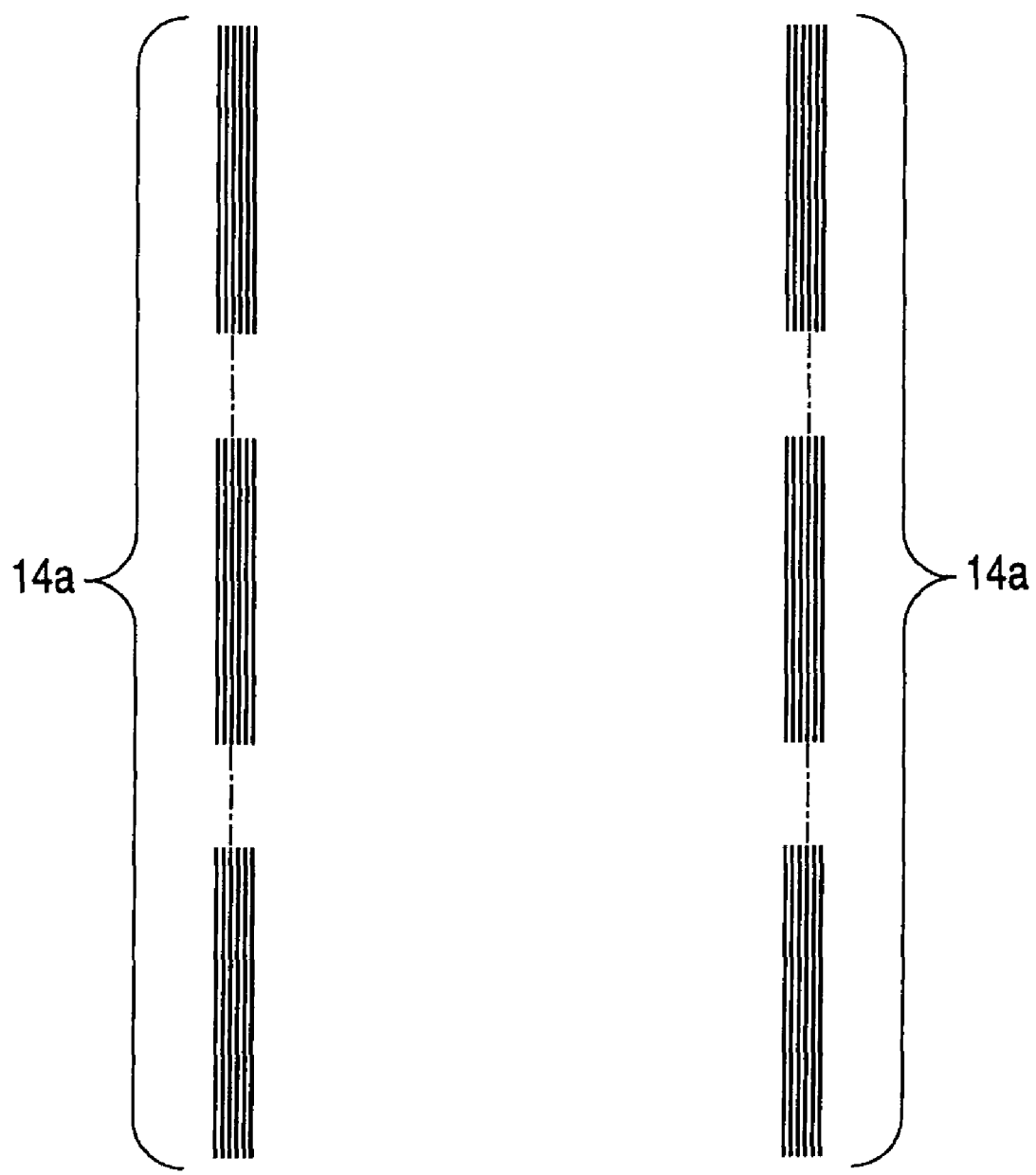
FIG. 10 is a plan view showing the results of the first reflective exposure process using a measurement mask pattern according to a fourth embodiment of the present invention.

FIG. 10 shows the results of the first exposure in which only the first pattern 14 described in the third embodiment is exposed. That is, FIG. 10 shows a first transferred image 14a of the first pattern 14. FIG. 11 shows the results of the second exposure in which the first pattern 14, second pattern 15, and third pattern 16 also described in the third embodiment are collectively exposed. That is, FIG. 11 shows that the second transferred image 14b of the first pattern 14 and the first transferred images 15a and 16a of the second pattern 15 and the third pattern 16. FIG. 12 shows the results of the first exposure in which only the above-described first pattern 14 is exposed and the results of the second exposure in which the first pattern 14, the second pattern 15, and the third pattern 16 are collectively exposed. That is, in FIG. 12, only the transferred image 14c of the first pattern 14 corresponds to the overlaid results of the two exposure processes. In contrast, the transferred image 15a of the second pattern 15 and the transferred image 16a of the third pattern 16 correspond to the results of the single exposure process. According to the present embodiment, in the bar in bar pattern 11 as a pattern overlay error measurement mask pattern, at least a part of the inner pattern 13 is formed to have the same size as that of the outer pattern 12.

According to the overlaid results of the two exposure processes, the error X1 between the first exposure and the second exposure can be calculated to be X1=(x11−x12)/2 using the bar in bar pattern 11 formed only of, for example, the first pattern 14. Since the size of the first pattern 14 remains unchanged after the first exposure and after the second exposure, the position shift amount X1 of the transferred image 14a resulting from the oblique incidence of the exposure light 5 is determined to be associated directly with the exposure apparatus (not shown in the drawings). The use of the position shift amount X1 allows the difference in position shift amount between the second pattern 15 and the first pattern 14 resulting purely from the difference in size between the first pattern 14 and the second pattern 15 to be calculated to be $X2=(x21-x22)/2-X1$. Similarly, the use of the position shift amount X1 allows the difference in position shift amount between the third pattern 16 and the first pattern 14 resulting purely from the difference in size between the first pattern 14 and the third pattern 16 to be calculated to be $X3=(x31-x32)/2-X1$.

The pattern transferred by the second exposure is preferably transferred to the outside of the pattern transferred by the first exposure. The bar in bar pattern 11 as a pattern overlay error mark is preferably configured to have a pattern layout such that the exposure size of the EUV exposure apparatus (not shown in the drawings) is appropriately adjusted to allow the pattern formed on the wafer 7 by the first exposure and the pattern formed on the wafer 7 by the second exposure to be formed using the single mask 1.

As described above, the fourth embodiment can exert effects similar to those of the above-described first to third embodiments. Furthermore, the present embodiment allows the error amount associated with the exposure apparatus to be eliminated. Thus, the difference in position shift amount corresponding purely to the pattern size can be measured using a common error measuring instrument. Thus, as is the case with measurement of common error, even if the outer and inner bar patterns are individually exposed, the error amount can be more quickly and more accurately measured for each pattern size. That is, more accurate data can be more efficiently acquired.

(Fifth Embodiment)

Now, a fifth embodiment according to the present invention will be described with reference to FIGS. 13A, 13B, 14A, 14B, 15A, 15B, 16A, and 16B. The same components of the fifth embodiments as those of the first to fourth embodiments are denoted by the same reference numerals and will not be described in detail.

For example, common pattern overlay error marks are normally formed using large patterns with a pattern width of at least about 1 μm. First, as shown in FIG. 13A, an outer pattern 102 in an exposure layer is formed around an inner pattern 101 formed in a lower layer on which the exposure layer is overlaid. Thereafter, the distance between the inner pattern 101 and the outer pattern 102 is measured to determine the overlay error between the patterns 101, 102. However, this method fails to accurately measure the error amount of a main body pattern 103 in the exposure layer because the size of the main body pattern 103 is different from that of an overlay error measurement mask pattern 104. Even if the overlay error amount (error width) measured using a conventional overlay error measurement mark 24 is zero "0", a slight error Z has occurred in a fine line and space pattern 23 in the main body as shown by a dashed line in FIG. 13B.

To solve such a problem, the present embodiment provides an overlay error measurement mask pattern that enables the error amount of the main body pattern to be accurately measured. That is, in the present embodiment, an alignment measurement technique will be described which allows the above-described error amount of patterns during exposure to be appropriately measured with the adverse effect of mask projection eliminated. To implement such a technique, the present embodiment forms an alignment measurement mask pattern such that the alignment measurement mask pattern has the same size and pitch of the mask pattern 6 main body transferred onto the wafer 7 and such that the alignment measurement mask pattern is shifted in the same direction as that for the mask pattern 6 main body by the same amount as that for the mask pattern 6 main body so as to be formed on the reflective exposure mask 1.

Figure 14A:
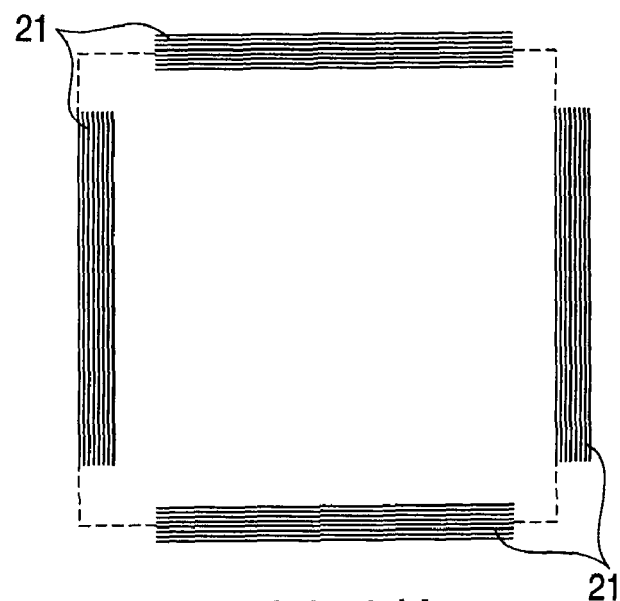
FIGS. 14A and 14B are plan views showing the results of a reflective exposure process using the overlay error measurement mask pattern according to the fifth embodiment of the present invention and in which no overlay error occurs.
Figure 14B:
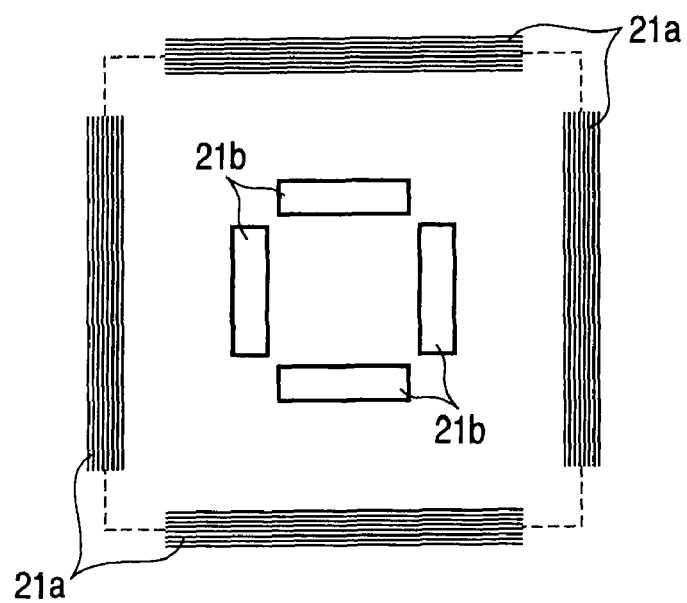

FIG. 14A shows the layout of an overlay error measurement mask pattern (overlay error measurement mark) 21 as an alignment measurement mask pattern on the reflective exposure mask 1. FIG. 14B shows the layout of transferred images (transferred patterns) 21a and 21b of the overlay error measurement mask pattern 21 formed by transferring the overlay error measurement mask pattern 21 to the wafer 7.

The overlay error measurement pattern 21 is formed to have the same pitch and size as those of the mask pattern 6 main body transferred onto the wafer 7. Furthermore, the overlay measurement mask pattern 21 is shifted in the same direction as that for the mask pattern 6 main body by the same amount as that for the mask pattern 6 main body so as to be formed on the reflective exposure mask 1. Specifically, as shown in FIG. 14A, two laterally opposite ones of the four patterns included in the overlay error measurement mask pattern 21 are formed such that the center of each of the patterns lies away from a dashed line indicating a reference for the formation position. More specifically, as shown in FIG. 14A, the two laterally opposite patterns 21 shown in FIG. 14A are formed such that the center of each of the patterns lies rightward away from the reference position. Furthermore, two vertically opposite ones 21 of the four patterns 21 included in the overlay error mask pattern 21 are formed as designed such that the patterns are each vertically centered on the reference position but displaced rightward by the same amount for the above-described laterally opposite patterns 21.

As described above, the pattern positions of the overlay error measurement mask pattern 21 shown in FIG. 14A are corrected before the exposure process is carried out. The image of the overlay error measurement mask pattern 21 transferred onto the wafer 7 is shaped as shown by the patterns 21a and 21b in FIG. 14B. As shown in FIG. 14B, no overlay error occurs in the transfer patterns 21a and 21b, corresponding to the image of the overlay error measurement mask 21 transferred onto the wafer 7. That is, transfer patterns are formed on the wafer 7 so that the center of the four outer transfer patterns 21a aligns with the center of the four inner transfer patterns 21b. The four outer transfer patterns 21a are formed as designed such that each of the patterns is centered on the reference position. Before the exposure process is carried out, the main body pattern 6 as a device pattern formation mask pattern is subjected to position correction performed on the overlay error measurement mask pattern 21. This substantially prevents the possibility of error between the transferred image of the main body pattern 6 in the lower layer and the transferred image of the main body pattern 6 in the exposure layer as shown in FIG. 14B.

Figure 15A:
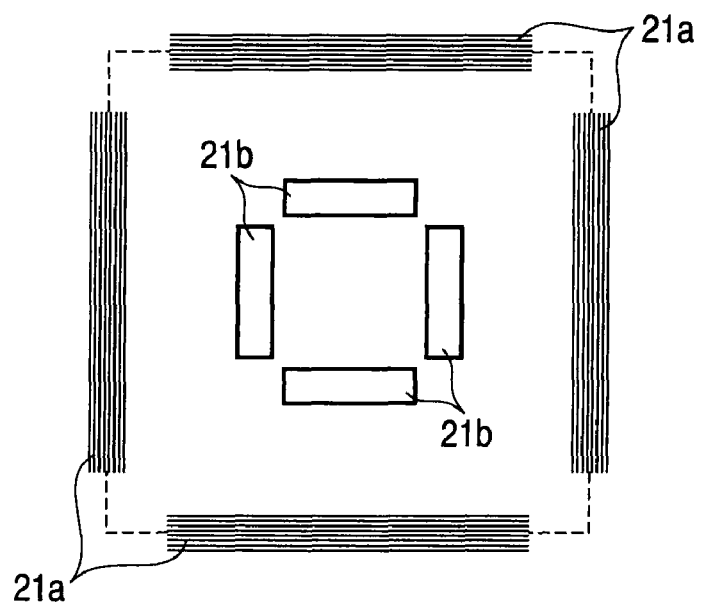
FIGS. 15A and 15B are plan views showing the results of reflective exposure in which there is no overlay error between the overlay error measurement mask pattern according to the fifth embodiment of the present invention and the device pattern formation mask pattern.
Figure 15B:
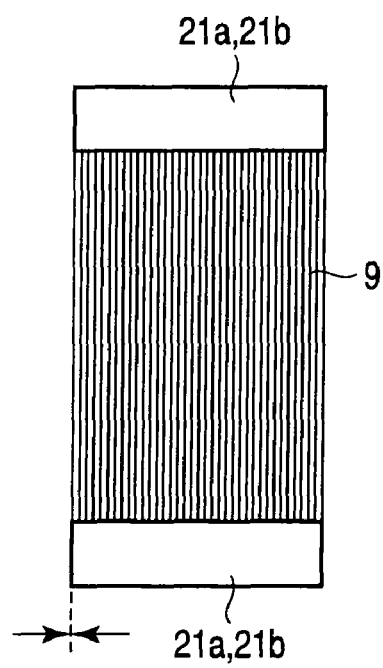

FIGS. 15A and 15B show that measurement of possible overlay error using the overlay error measurement mask pattern 21 indicates no overlay error between the transferred image 9 of the mask pattern 6 main body and both the transferred images 21a and 21b of the overlay error measurement mask pattern 21 on the wafer 7. As shown in FIG. 15A, each of the transfer patterns 21a of the overlay error measurement mask pattern 21 is formed so as to be centered on a dashed line indicating a reference for the formation position of the pattern. Furthermore, the overlay error measurement mask pattern 21 is formed such that the center of the four outer transfer patterns 21a aligns with the center of the four inner transfer patterns 21b. Moreover, as shown by dashed lines in FIG. 15B, the amount of the overlay error between the transfer pattern 9 of the mask pattern 6 main body and the transfer pattern 21a of the overlay error measurement mask pattern 21 is almost zero "0".

Figure 16A:
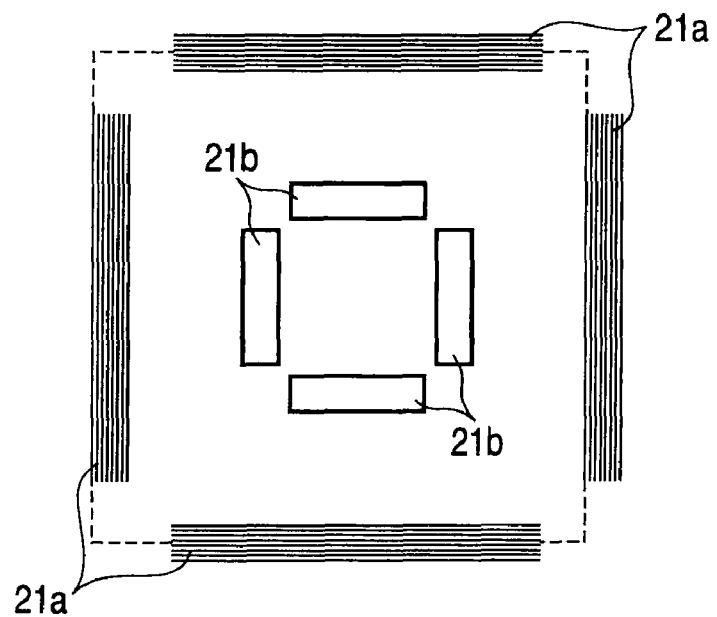
FIGS. 16A and 16B are plan views showing the results of reflective exposure in which there is overlay error between the overlay error measurement mask pattern according to the fifth embodiment of the present invention and the device pattern formation mask pattern.
Figure 16B:
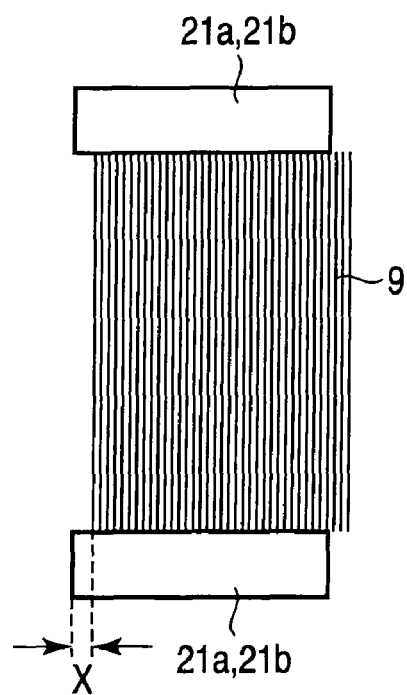

In contrast, FIGS. 16A and 16B show that measurement of possible overlay error using the overlay error measurement mask pattern 21 indicates the presence of overlay error between the transferred image 9 of the mask pattern 6 main body and both the transferred images 21a and 21b of the overlay error measurement mask pattern 21 on the wafer 7. As shown in FIG. 16A, each of the transfer patterns 21a of the overlay error measurement mask pattern 21 is formed such that the center of the pattern lies away from a dashed line indicating a reference for the formation position of the pattern. Furthermore, the overlay error measurement mask pattern 21 is formed such that the center of the four outer transfer patterns 21a and the center of the four inner transfer patterns 21b are an error. Moreover, as shown by dashed lines in FIG. 16B, there is overlay error the magnitude of which is denoted by X in FIG. 16B, between the transfer pattern 9 of the mask pattern 6 main body and the transfer pattern 21a of the overlay error measurement mask pattern 21.

Thus, in the present embodiment, the transferred images 21a and 21b of the overlay error measurement mask pattern 21 clearly reflect the error of the transferred image of the mask pattern 6 main body.

As described above, the fifth embodiment can exert effects similar to those of the above-described first to fourth embodiments. In particular, the present embodiment allows the error amount of the patterns during exposure to be appropriately measured with the adverse effect of mask projection eliminated.

(Sixth Embodiment)

Now, a sixth embodiment according to the present invention will be described without illustration. In the present embodiment, a method for manufacturing a mask will be described which method is characterized in that a mask pattern is formed based on mask pattern data generated by the method for generating mask pattern data according to at least one of the above-described first to fifth embodiments. The same components of the sixth embodiments as those of the first to fourth embodiments are denoted by the same reference numerals and will not be described in detail.

First, data on the mask pattern 6 is generated by the method for generating mask pattern data according to at least one of the first to fifth embodiments. Subsequently, based on the data, the absorption layer 4 is patterned to form the mask pattern 6 on the reflection layer 3 (mask blank 2). Thus, the reflective exposure mask 1 can be manufactured which includes the desired mask pattern 6 allowing fine patterns to be transferred to and formed on wafer 7.

As described above, the sixth embodiment utilizes the method for generating mask pattern data according to at least one of the above-described first to fifth embodiments. The sixth embodiment can thus provide a method for manufacturing a mask which method allows fine patterns to be precisely formed during a lithography process using a reflective optical system.

(Seventh Embodiment)

Now, a seventh embodiment according to the present invention will be described without illustration. In the present embodiment, a method for manufacturing a semiconductor device will be described which method utilizes the method for generating mask pattern data according to at least one of the above-described first to fifth embodiments. The reflective exposure mask 1 manufactured by the method for generating a mask according to the above-described sixth embodiment is the reflective exposure mask 1 manufactured utilizing the method for generating mask pattern data according to at least one of the first to fifth embodiments as described above. Thus, in the present embodiment, a method for manufacturing the reflective exposure mask 1 manufactured by the method for manufacturing a mask according to the sixth embodiment will be described. The same components of the seventh embodiments as those of the first to sixth embodiments are denoted by the same reference numerals and will not be described in detail.

First, the reflective exposure mask 1 manufactured by the method for manufacturing a mask according to the sixth embodiment is used to transfer the mask pattern 6 to a resist film (not shown in the drawings) on the wafer (semiconductor substrate) 7. Furthermore, the resist film is developed to form a resist pattern. Subsequently, a processed film (not shown in the drawings) and the semiconductor substrate 7, which are located below the resist film, are processed along a resist pattern formed on the resist film. Thus, the desired fine device pattern 9 can be very precisely formed on the processed film and the semiconductor substrate 7. Thereafter, the semiconductor substrate 7 on which the device pattern 9 is formed is delivered to a transistor manufacturing process, a wiring forming process, a dicing process, a chip mounting process, a bonding process, a molding process, and the like. Thus, the desired semiconductor device according to the present embodiment (not shown in the drawings) is obtained.

As described above, the seventh embodiment performs pattern transfer using the reflective exposure mask 1 manufactured by the method for manufacturing a mask according to the sixth embodiment. Thus, fine patterns can be precisely formed during a lithography process using a reflective optical system. Consequently, various semiconductor elements, wiring, and the like can be precisely, efficiently, and easily formed on the semiconductor substrate or the like. This allows the efficient and easy manufacture of a high-quality semiconductor device with precisely formed patterns and with performance, reliability, quality, yield, and the like improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for generating data for a mask pattern to be formed on a reflective exposure mask, comprising:
    creating a position correction amount table for correcting a transfer position error occurring when the mask pattern is transferred onto an exposure target member, an amount of the transfer position error depending on:
        at least one of a pattern size and a pattern pitch of the mask pattern, and
        an incident angle of an exposure light incident on the reflective exposure mask; and
    generating the data for the mask pattern based on the position correction amount table.

2. The method according to claim 1, further comprising:
    generating mask pattern data for an overlay error measurement mask pattern, the overlay error measurement mask pattern being formed on the reflective exposure mask and having a same pattern size and pattern pitch as those of the mask pattern.

3. The method according to claim 1, wherein a relationship between the pattern pitch and the amount of the transfer position error is set in the position correction amount table.

4. The method according to claim 1, wherein a relationship between the pattern size and the amount of the transfer position error is set in the position correction amount table.

5. The method according to claim 1, wherein the position correction amount table is created based on a transfer position of a measurement mask pattern obtained when the measurement mask pattern is transferred using a reflective exposure mask on which the measurement mask pattern is formed, the measurement mask pattern including:
- an outer pattern group having plural pairs of outer patterns in each of which periodic patterns with the same pitch or patterns with the same size are arranged opposite each other; and
- an inner pattern group having plural pairs of inner patterns each arranged inside the corresponding outer pattern pair and in each of which periodic patterns with the same pitch or patterns with the same size are arranged opposite each other, the inner pattern pairs comprising periodic patterns with different pitches or patterns with different sizes.

6. The method according to claim 5, wherein the position correction amount table is created by measuring, for each of the outer pattern pairs included in the measurement mask pattern and the inner pattern pair located inside the outer pattern pair, a difference in a transfer position of the outer pattern pair and in a transfer position of the inner pattern pair located inside the outer pattern pair.

7. The method according to claim 5, wherein at least one of the inner pattern pairs includes periodic patterns with the same pitch as that of the outer pattern pair or patterns with the same size as that of the outer pattern pair.

8. The method according to claim 5, wherein the inner pattern pairs and the outer pattern pairs are formed outside an area in which a device pattern is formed.

9. The method according to claim 5, wherein the position correction amount table is created by performing exposure once using the reflective exposure mask.

10. The method according to claim 5, wherein exposure light is allowed to obliquely enter a surface on which the mask pattern is formed when the mask pattern is transferred onto a semiconductor substrate using the reflective exposure mask.

11. The method according to claim 10, wherein the exposure light is EUV.

12. The method according to claim 1, wherein the method uses first and second reflective exposure masks:
- the first reflective exposure mask has a first measurement mask pattern, the first measurement mask pattern having an outer pattern group with plural pairs of outer patterns in each of which periodic patterns with the same pitch or patterns with the same size are arranged opposite each other; and
- the second reflective exposure mask has a second measurement mask pattern, the second measurement mask pattern having an inner pattern group with plural pairs of inner patterns in each of which periodic patterns with the same pitch or patterns with the same size are arranged opposite each other, the inner pattern pairs comprising periodic patterns with different pitches or patterns with different sizes,
- the first and second reflective exposure masks are configured such that the inner patterns are transferred to inside of the outer patterns, and the position correction amount table is created based on transfer positions of the first and second measurement mask patterns obtained when the first and second measurement mask patterns are transferred using the first and second reflective exposure mask.

13. The method according to claim 12, wherein the position correction amount table is created by measuring, for each of the outer pattern pairs included in the measurement mask pattern and the inner pattern pair located inside the outer pattern pair, a difference in a transfer position of the outer pattern pair and in a transfer position of the inner pattern pair located inside the outer pattern pair.

14. The method according to claim 12, wherein at least one of the inner pattern pairs includes periodic patterns with the same pitch as that of the outer pattern pair or patterns with the same size as that of the outer pattern pair.

15. The method according to claim 12, wherein the outer patterns are transferred by first exposure, and the inner patterns are transferred by second exposure.

16. The method according to claim 12, wherein exposure light is allowed to obliquely enter a surface on which the mask pattern is formed when the mask pattern is transferred onto a semiconductor substrate using each of the first and second reflective exposure masks.

17. The method according to claim 1, wherein the reflective exposure mask comprises:
- a substrate;
- a reflection layer provided on the substrate and reflecting exposure light; and
- an absorption layer provided on the reflection layer and formed to have a shape corresponding to a device pattern.

18. The method according to claim 1, wherein the transfer position error is an error of the transferred image of the mask pattern on the exposure target member resulting from an oblique incidence of the exposure light on the reflective exposure light mask.

19. A method for manufacturing a semiconductor device comprising transferring a mask pattern onto a semiconductor substrate, the mask pattern being created based on mask pattern data generated by the method according to claim 1.

20. A non-transitory computer-readable storage medium storing a program, which, when executed by a computer, performs a method for generating data for a mask pattern to be formed on a reflective exposure mask, the method comprising:
- creating a position correction amount table for correcting a transfer position error occurring when the mask pattern is transferred onto an exposure target member, an amount of the transfer position error depending on:
  - at least one of a pattern size and a pattern pitch of the mask pattern, and
  - an incident angle of an exposure light incident on the reflective exposure mask; and
- generating the data for the mask pattern based on the position correction amount table.

* * * * *